(12) United States Patent
Dohno et al.

(10) Patent No.: US 7,056,297 B2
(45) Date of Patent: Jun. 6, 2006

(54) WEARABLE HUMAN MOTION APPLICATOR

(75) Inventors: Shigeru Dohno, Osaka (JP); Shingo Yuasa, Sunnyvale, CA (US); Akihiko Saito, Shijonawate (JP)

(73) Assignee: Matsushita Electric Works, Ltd., Kadoma (JP)

( * ) Notice: Subject to any disclaimer, the term of this patent is extended or adjusted under 35 U.S.C. 154(b) by 527 days.

(21) Appl. No.: 10/298,933

(22) Filed: Nov. 19, 2002

(65) Prior Publication Data

US 2003/0125781 A1 Jul. 3, 2003

(30) Foreign Application Priority Data

Dec. 28, 2001 (JP) ............................ 2001-401538
Jan. 31, 2002 (JP) ............................ 2002-024623
Jun. 28, 2002 (JP) ............................ 2002-191212

(51) Int. Cl.
*A61H 1/00* (2006.01)
*A61F 2/58* (2006.01)
*A61F 2/64* (2006.01)

(52) U.S. Cl. ..................... 601/48; 601/47; 601/152; 310/316.01; 310/317; 310/338; 607/48

(58) Field of Classification Search ............... 600/595, 600/587, 552–553; 310/316.01, 317, 338; 601/84, 46–48, 78–81; 607/48–49
See application file for complete search history.

(56) References Cited

U.S. PATENT DOCUMENTS 5,004,391 A * 4/1991 Burdea ........................ 414/6
5,143,505 A * 9/1992 Burdea et al. ................ 414/5
5,429,140 A    7/1995 Burdea et al.
5,631,861 A    5/1997 Kramer
6,809,462 B1 * 10/2004 Pelrine et al. ............. 310/319

FOREIGN PATENT DOCUMENTS

JP    2002-48053     2/2002
WO    WO 01/06579    1/2001
WO    WO 01/91100   11/2001

OTHER PUBLICATIONS

R. Kornbluh, et al., Proceeding of the 1998 IEEE International Conference on Robotics & Automation, pp. 2147-2154, XP-010281583, "Electrostrictive Polymer Artificial Muscle Actuators", May 16, 1998.

* cited by examiner

*Primary Examiner*—Robert Pezzuto
*Assistant Examiner*—Shevon Johnson
(74) *Attorney, Agent, or Firm*—Oblon, Spivak, McClelland, Maier & Neustadt, P.C.

(57) ABSTRACT

An improved human motion applicator assures a quick and sufficient amount of displacement given to a part of a human body. The applicator includes a support adapted to be fitted on the part of the human body. The support carries at least one electro-active elastic actuator in a force-transmitting relation to the human part. The actuator includes a dielectric core and a pair of electrodes on opposite of the core for receiving a driving DC voltage thereacross. The elastic actuator has a length and elastically deforms in the lengthwise direction to exert a stretching force to the human part to a greater extent as the driving DC voltage increase. The applicator also includes a controller which applies the driving DC voltage of varying levels to the elastic actuator, thereby generating a varying motion-inducing force to be applied to the part of the human body.

9 Claims, 10 Drawing Sheets

WEARABLE HUMAN MOTION APPLICATOR

TECHNICAL FIELD

The present invention is directed to a wearable human motion applicator, and more particularly to a human motion assisting or inducing device utilizing an electro-active elastic actuator.

BACKGROUND ART

Human motion applicator is proposed in Japanese Patent Early Publication No. 2002-48053 which utilizes a memory shape alloy which deforms in response to heat generated by application of electric current for giving a stretching or contracting force to thereby assist a motion intended by a human body. However, due to a limitation to the amount of the displacement and a response speed given to the memory shape alloy, the prior art motion applicator is found insufficient in that it is not completely in match with an actual need of assisting or inducing the human motion.

DISCLOSURE OF THE INVENTION

The above insufficiency has been reduced in the present invention which provides an improved human motion applicator which assures a quick and sufficient amount of displacement given to a part of a human body. The human motion applicator in accordance with the present invention includes a support adapted to be fitted on the part of the human body. The support carries at least one electro-active elastic actuator in a force-transmitting relation to the part of the human body. The elastic actuator includes a dielectric core and a pair of electrodes on opposite of the core for receiving a driving DC voltage thereacross. The elastic actuator has a length and elastically deforms in the lengthwise direction to exert a stretching force to the human part to a greater extent as the driving DC voltage increases. The applicator also includes a DC voltage source for providing the driving DC voltage and a controller which applies the driving DC voltage of varying levels to the elastic actuator, thereby generating a varying motion-inducing force to be applied to the human part. Accordingly, the elastic actuator can give quick and sufficient amount of deformation to the part of the human body, giving consistent and smooth motion sufficient for assisting or inducing the motion as intended by the human.

Preferably, the support is made of a flexible material and is adapted to be fitted around the part, giving a tubular configuration surrounding the part. The actuator is secured to the flexible support so as to deform elastically together with the support. Thus, the force generated at the actuator can be successfully transmitted to the part of the human body without being substantially interfered with the support.

The applicator is preferred to include a motion sensor which senses a motion of the human part being made and provides a motion signal indicative of a quantity of the motion. In response to the motion signal, the controller applies the driving DC voltage of a level specific to the motion signal so as to give the force of suitable strength for assisting or impeding the motion.

Instead of the motion sensor, the applicator may be equipped with a signal generator which generates a random signal indicative of the driving DC voltage varying randomly. In response to the random signal, the controller applies to the actuator the driving DC voltage which varies randomly such that the actuator exerts the randomly varying force to the applicator, which compels the human to generate a counterforce and therefore provides a muscle training or rehabilitation capability.

In a preferred version, the applicator includes a direction sensor which senses a direction of a motion being made at the human part to provide a direction signal indicative of the direction of the motion, and a selector which activates one of a motion-assisting mode and a motion-training mode given to the controller. In the motion-assisting mode, the controller is responsive to the direction signal for giving the driving DC voltage of a level that deforms the elastic actuator in a direction of assisting the human motion being made. In the motion-training mode, the controller is responsive to the direction signal for giving the driving DC voltage of a level that deforms the elastic actuator in a direction of opposing the human motion being made. With this arrangement, the applicator can be utilized selectively as a human motion assisting device or a human motion training device.

In order to make the applicator well adapted for assisting a joint motion of the human body, the applicator includes the support which is configured to be fitted around a joint of the human body, and includes a motion sensor which senses a direction and a quantity of the motion being made around the joint to provide a motion signal indicative of the direction and the quantity of the motion. In response to the motion signal, the controller applies the driving DC voltage of a level deforming the elastic actuator in a direction of assisting the bending or unbending of the joint.

For successfully assisting the joint motion, the support is made to have a tubular configuration having a lengthwise axis when fitted around the joint, and carries a pair of the elastic actuators at diametrically opposite ends of the tubular support about the lengthwise axis, one at the front side and the other at the rear side of the joint. In response to the motion signal, the controller selects one of the elastic actuator and applies thereto the driving DC voltage of a level expanding the same elastic actuator in a direction of assisting the bending or unbending the joint. This technique is in consistent with the actuator joint motion and assures a smooth and comfortable motion assistance.

Further, the controller may be configured to be responsive to the motion signal for selecting one of the elastic actuators and applying thereto the driving DC voltage of a high level expanding the same elastic actuator and at the same time applying to the other elastic actuator the driving DC voltage of a low level contracting it from an expanded condition for assisting the bending or unbending of the joint. The two resulting forces generate a force couple around the joint to facilitate the joint motion.

The applicator of the present invention can be also utilized for reducing a distortion about a torso of the human body. For this purpose, the support is shaped into a tubular configuration having a lengthwise axis to be fitted around the torso. The support carries a pair of the elastic actuators each shaped into a band extending around the lengthwise axis. The two actuators or bands extend at different angles with respect to the lengthwise axis to cross with each other. A motion sensing means is included in the applicator to sense amounts of strains of the torso respectively about the lengthwise axis and a horizontal axis perpendicular to the lengthwise axis, and provides a strain signal indicative of the amounts of the strains. In response to the strain signal, the controller gives to the elastic actuators respectively the driving DC voltages of varying level in order to elastically deform the elastic actuators in a direction of reducing the amounts of the strain.

For the applicator equipped with the motion sensor, the controller is preferred to include a table storing a plurality of programs respectively assigning different levels of the driving DC voltage to the sensed quantity of the motion. A program selector is included in the applicator to select one of the programs for deforming the actuator in accordance with the selected program. Thus, the applicator can be easily tailored to individuals of different muscle strengths.

The elastic actuator may be realized by at least one fiber each composed of the dielectric core of a hollow cylinder and the electrodes disposed respectively on the exterior and interior surfaces of the cylinder. Thus, the actuator can be given along its length a preference direction of deformation, while the electrodes can be given a large specific surface with respect to a cross section of the dielectric core, thereby increasing the electro-active force of deforming the actuator along its length with a minimum DC voltage, and therefore assuring efficient power drive. The dielectric core of the hollow cylinder may be filled with the interior electrode in order to minimize the diameter of the fiber. Preferably, the outer electrode is surrounded by a dielectric sheath. Further, a plurality of the fibers with the dielectric sheath may be packed together to form a single deformable module.

In order to bring the actuator itself well adapted to the contour of the part of the human body, at least one strand of the fiber is woven into a knitted structure showing its own resiliency that is additive to the elastic deformability given to the fiber. In this connection, the elastic actuator or the fiber can be knitted into a cylindrical configuration so as to be fitted around the part of the human body. The knitted fiber of the cylindrical configuration may fit intimately on the flexible support of the analogous cylindrical configuration or may define itself a major part of the support.

The fiber may be coiled to define the elastic actuator of a cylindrical configuration to be fitted around the part of the human body.

Further, the elastic actuator may include the dielectric core in the form of a resilient sheet having a front surface and a rear surface which are coated respectively with the electrodes. Each of the electrodes has a plurality of flexible pads which are deposited in spaced relation with each other and are electrically interconnected to have the same potential. With this arrangement, the electrode can be made to have sufficient flexibility to follow the resilient deformation of the resilient sheet, thereby giving improved resiliency to the whole actuator.

Alternatively, each of the electrodes is shaped in the form of a perforated having a plurality of voids fro making the electrode flexible.

In order to increase the strength of the force exerted by the actuator, the actuator can be a laminate in which a plurality of the meshed membrane electrodes are stacked alternately with a plurality of the dielectric cores each in the form of the resilient membrane.

When the actuator is composed of the resilient dielectric sheet coated on opposite surfaces thereof respectively with the electrodes in the form of the plural flexible pads or the meshed membrane, the actuator can be shaped into a cylindrical configuration so as to surround the part of the human body, thereby facilitating the assembly of the applicator.

Further, the actuator can be mechanically pre-compressed in one particular direction to produce a mechanical spring force which is additive to the electro-active force generated by application of the driving DC voltage. In this manner, the actuator can have a preference direction of deformation in which the actuator deforms predominantly upon receiving the driving DC voltage, thereby exerting the resulting force mainly along the intended direction to the part of the human body. For this purpose, the electrodes on opposite surfaces of the dielectric core can be pre-compressed to give the mechanical spring force.

These and still other objects and advantageous features of the present invention will become more apparent from the following description of the embodiments when taken in conjunction with the attached drawings.

DETAILED EXPLANATION OF THE EMBODIMENTS

Figures 1, 2:
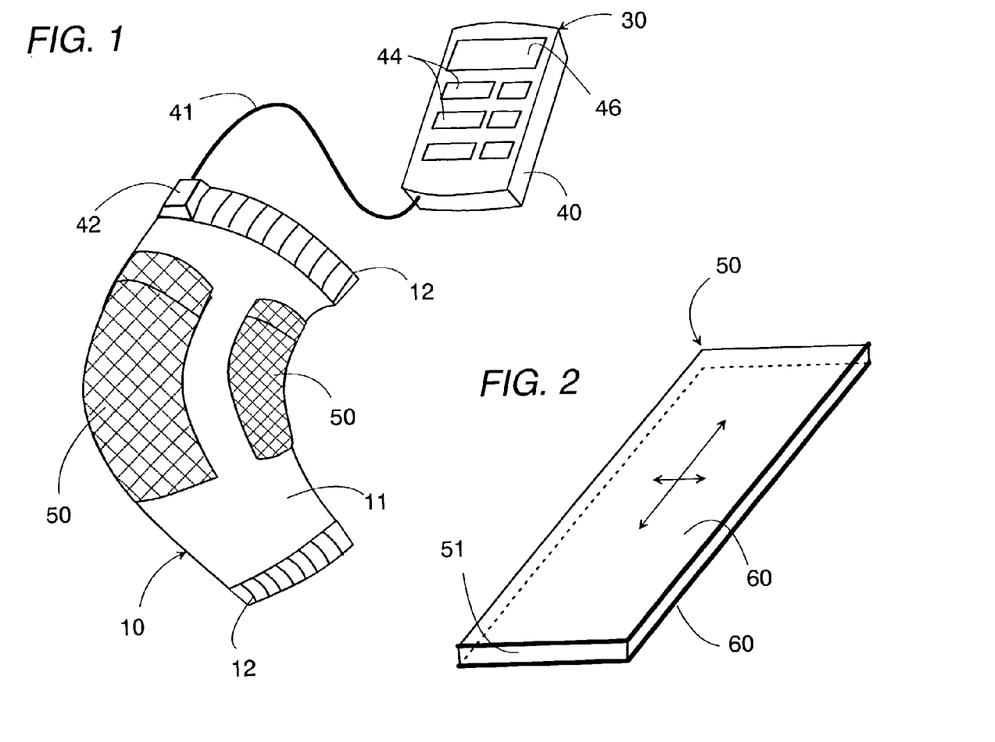
FIG. 1 is a perspective view of a wearable human motion applicator in accordance with a first embodiment of the present invention.
FIG. 2 is a perspective view of an electro-active elastic actuator employed in the above applicator.
Figures 8, 9A, 9B:
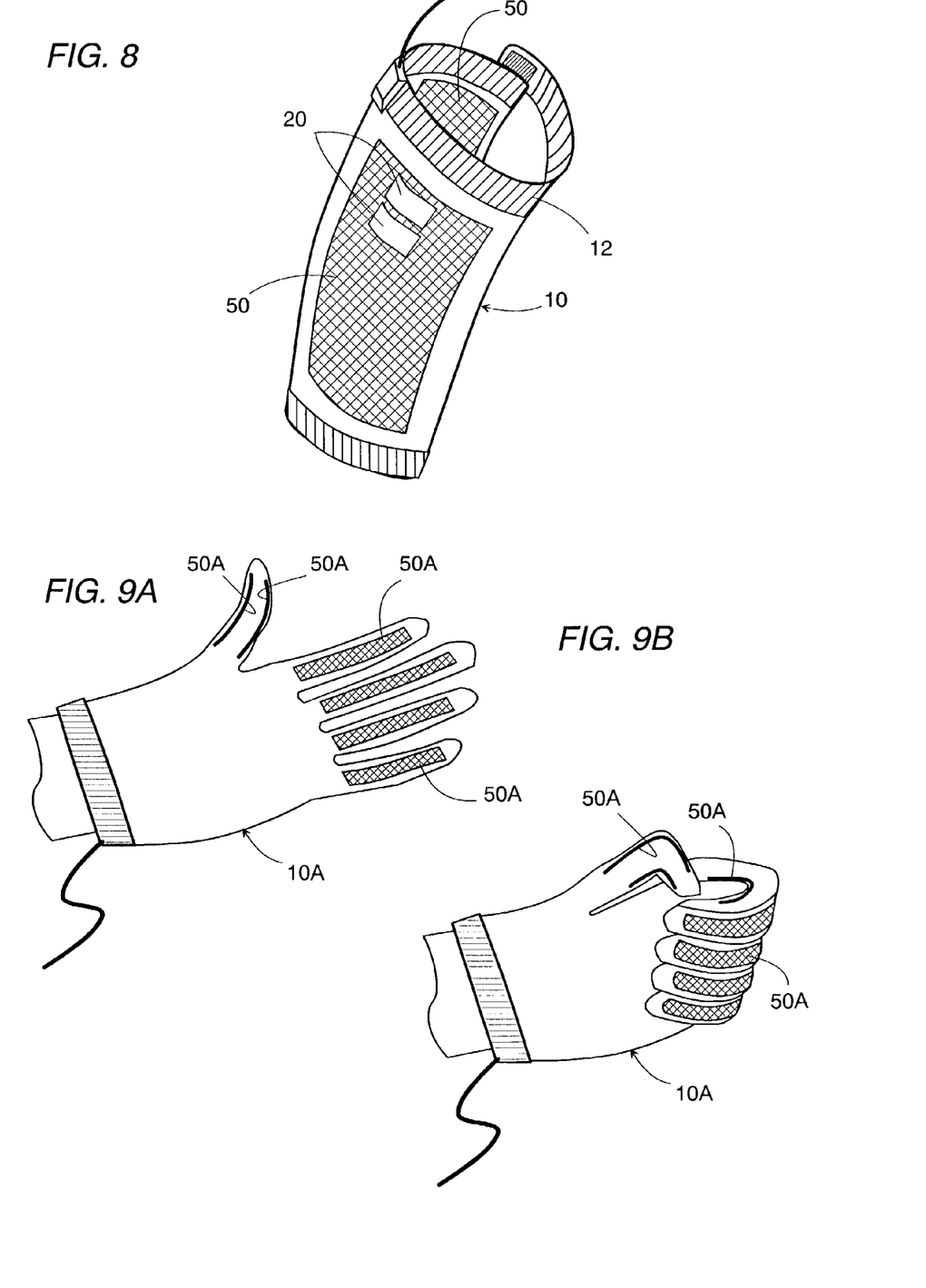
FIG. 8 is a perspective view of the above applicator.
FIGS. 9A and 9B are schematic views respectively illustrating a wearable human motion applicator in accordance with a second embodiment of the present invention.

Referring now to FIG. 1, there is shown a wearable human motion applicator in accordance with a first embodiment of the present invention. The applicator includes a flexible support 10 carrying a pair of electro-active elastic actuators 50, and a controller 30 carried on a user, for example, attached to clothing of the user or placed in a pocket of the clothing. The flexible support 10 includes a main body 11 of a stretchable fabric adapted to be fitted around a part such as a knee joint of the human body and includes fasteners 12 for tightly holding the support 10 around the part. The main body 11 may be fabricated into a sleeve or bandage as shown in FIG. 8. The actuator 50 is generally known as the electrostrictive polymer actuator and is composed of a dielectric core 51 made of an elastomeric polymer such as acrylic elastomer and silicone, and a pair of flexible electrodes 60 on opposite surfaces of the core. As shown in FIG. 2, the actuator 50 of the present embodiment is provided in the form of an elongated sheet with the electrodes 60 spaced in a thickness direction of the sheet. The electrode 60 is formed of a mixture of carbon black and a precious metal filter which is dispersed in or coated on the surface of the polymer and is given flexibility to follow an elastic deformation of the polymer. Upon receiving a driving DC voltage across the electrodes 60, the actuator 50 is compressed in the thickness direction to resiliently expand in the length and width directions as a result of that the electrodes are attracted toward each other. When the DC voltage is removed, the actuator 50 returns to original dimensions, i.e., contracts by resiliency inherent to the polymer. The amount of this elastic deformation is proportional to the DC voltage. Thus, the actuator 50 can expand to a greater extent as the DC voltage increases and therefore contracts with decreasing DC voltage. In this connection, the controller 30 is configured to vary the DC voltage applied across the electrodes 50.

Figure 3A:
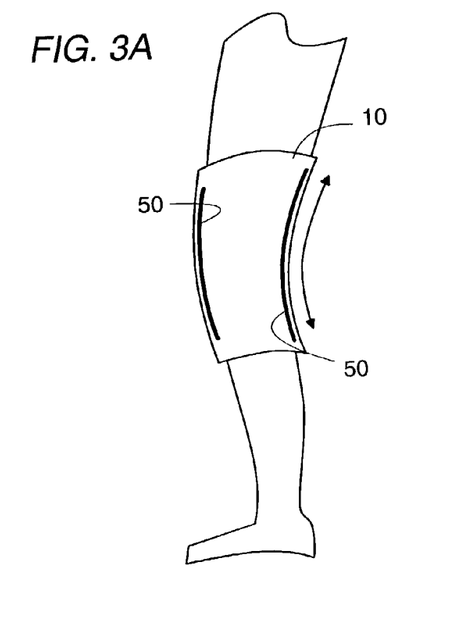
FIGS. 3A and 3B are explanatory views illustrating the operation of the above applicator.
Figure 3B:
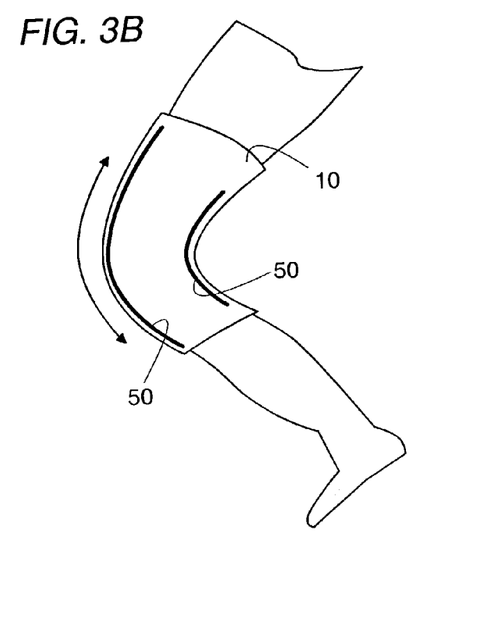
Figure 4:
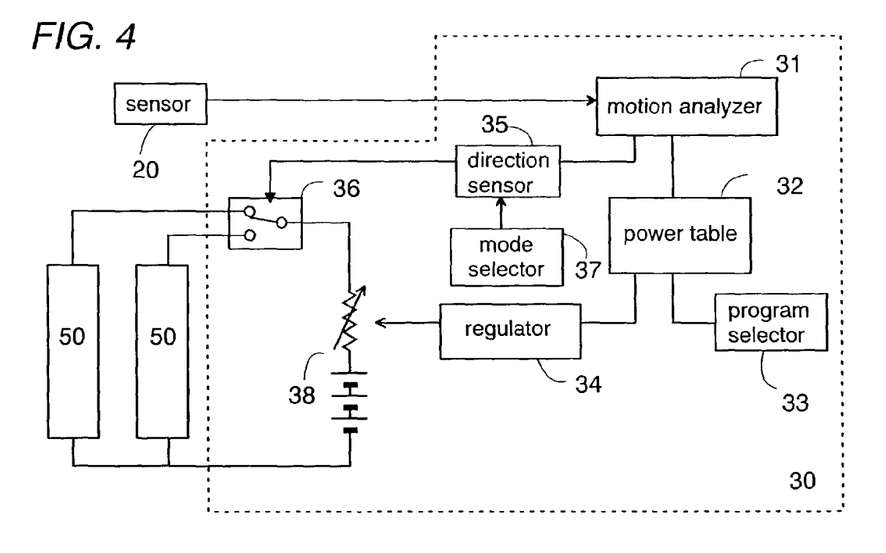
FIG. 4 is a block diagram of an electric circuit of the above applicator.
Figure 5:
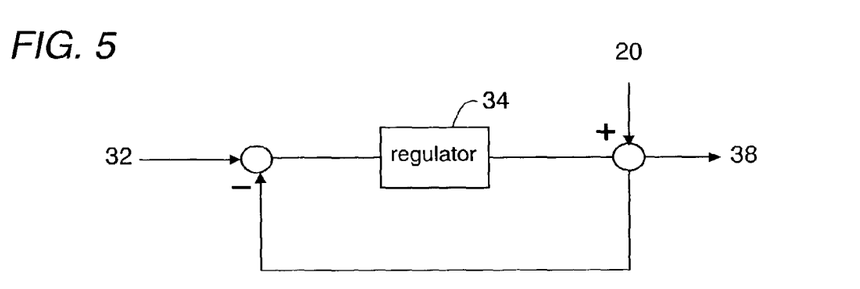
FIG. 5 is a block diagram illustrating a feedback control utilized in the above applicator.
Figure 6:
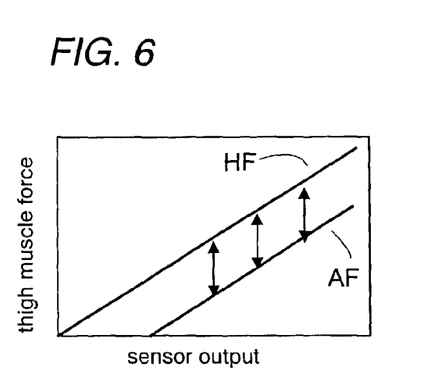
FIGS. 6 and 7 are graphs respectively illustrating the operation of the above applicator.
Figure 7:
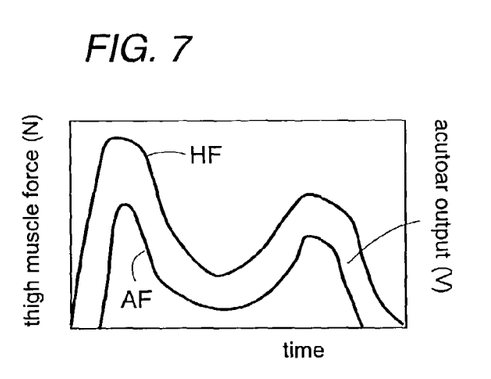

As shown in FIGS. 3A and 3B, the support 10 is fitted around the knee joint with the one actuator 50 on front of the joint and the other on the rear thereof in order to generate a force of assisting the bending or unbending of the joint. For this purpose, the applicator includes a sensor 20 which is disposed inside of the support 10 to come into contact with the skin around the joint for sensing the motion of the joint being made. The sensor 20 may be a strain gauge, myoelectric sensor, or pressure sensor, and monitors an instant force exerted by a thigh muscle to give an output indicative of the monitored result. As shown in FIG. 4, the controller 30 includes a motion analyzer 31 which analyzes an output from the sensor 20 to determine the instant amount of the measured force as well as the direction of the force, i.e., whether the knee is bending or unbending. That is, the motion analyzer 31 is cooperative with the sensor 20 to define a motion sensor which provides a motion signal indicative of the amount and direction of the motion being made at the joint by the human body. The controller 30 is configured to give the varying DC voltage across the electrodes 60 of the actuator for generating an assisting force (AF) which is proportional to and is less than the actual human force (HF) by a constant amount, as shown in FIG. 6. In view of that the muscle power is different for individuals, the controller 30 is equipped with a power table 32 which stores a plurality of programs respectively defining different relations between the monitored amount of the human force (HF) and a target value for the assisting force (AF). A program selector 33 is included in the controller 30 to select one of the programs for providing the target value of the assisting force with regard to the monitored human force (HF). In accordance with the selected program, a regulator 34 responds to give a control signal to a variable DC voltage source 38 so as to vary the driving DC voltage being applied to the actuator in a feedback manner based upon the target value from the power table 34, as shown in FIG. 5, to regulate the driving DC voltage. With this result, the assisting force (AF) generated by the actuator can follow exactly the actual human force (HF), as shown in FIG. 7, which demonstrates the synchronous relation between the thigh muscle force representative of the human force (HF) and the actuator output representative of the assisting force (AF) both varies within one cycle of a walking step. The variable DC voltage source 38 is accommodated within a controller housing 40 together with the switch 36, and is connected to the actuators 50 by way of a cable 41 and a detachable adapter 42 at one end of the support. Electrical connection from the adapter 42 to the actuators 50 are made through electrically conductive threads or the like flexible wires.

The motion signal is also fed to a direction selector 35 where the direction of the monitored human force is acknowledged to determine which one of the actuators 50 is enabled to expand by application of the DC voltage defined by the selected program. That is, when the sensor output increases as a result of that the knee is bending from the position of FIG. 3A to that of FIG. 3B, the direction selector 35 activates a switch 36 to energize the actuator 50 on the front of the knee, and to deenergize the rear actuator, thereby expanding the front actuator in a direction of assisting the knee bending. While on the other hand, when the sensor output decreases in correspondence to the unbending of the knee, the direction selector 35 activates the switch 36 to energize the rear actuator 50 and to deenergize the front actuator 50, thereby expanding the rear actuator for assisting the unbending motion.

In addition to assisting the joint motion, the applicator of the present embodiment can be utilized to strengthen the thigh muscle by generating the force opposing the human motion. For this purpose, the controller 30 is programmed to provide a motion-assisting mode for generating the assisting force and a motion-training mode for generating the opposing force, and includes a mode selector 37 for selecting one of the modes. When the motion-training mode is selected, the direction selector 35 acts in an opposite sense to the above motion-assisting mode, i.e., to activate one of the actuators in a direction of bending the joint when the joint is actually unbending, and vice versa.

On the front of the controller housing 40, there are provided buttons 44 for selecting the modes and the programs, as well as a display 46 for the selected mode and the program.

It is noted that when bending or unbending the joint, one of the actuators is caused to expand while the other actuator is caused to contract from the expanded condition, thereby developing a force couple about the joint and therefore enhancing the performance of the applicator. However, it is equally possible to use only one actuator on the front side of the joint for expanding it in order to assist bending the joint since the human is required more power when bending the joint than unbending it.

Further, although it is preferred to dispose the actuator 50 on the inner surface of the support 10 for direct force-transmitting contact with the part of the human body, the actuator 50 may be incorporated in the support 10 or even outer surface of the support, provided that it keeps a force-transmitting relation to the part of the human body through the support.

As shown in FIG. 8, the support 10 may be provided with two sensors 20 spaced along the length of the support and are utilized to give an average of the monitored results or to obtain reliable human motion data.

FIGS. 9A and 9B show a second embodiment of the present invention in which the applicator includes the flexible support in the form of a glove 10A for assisting and/or training the finger motion. Each finger of the glove is provided on the palm and back sides respectively with two opposing actuators 50A. These actuators on either side of the hand are electrically connected in parallel across the like DC voltage source so as to be energized simultaneously for generating the forces acting together to bend or unbend the fingers. The other structures and operations are identical to those of the first embodiment. In this embodiment, the sensor may be provided on anyone of the glove fingers.

Figures 10, 11:
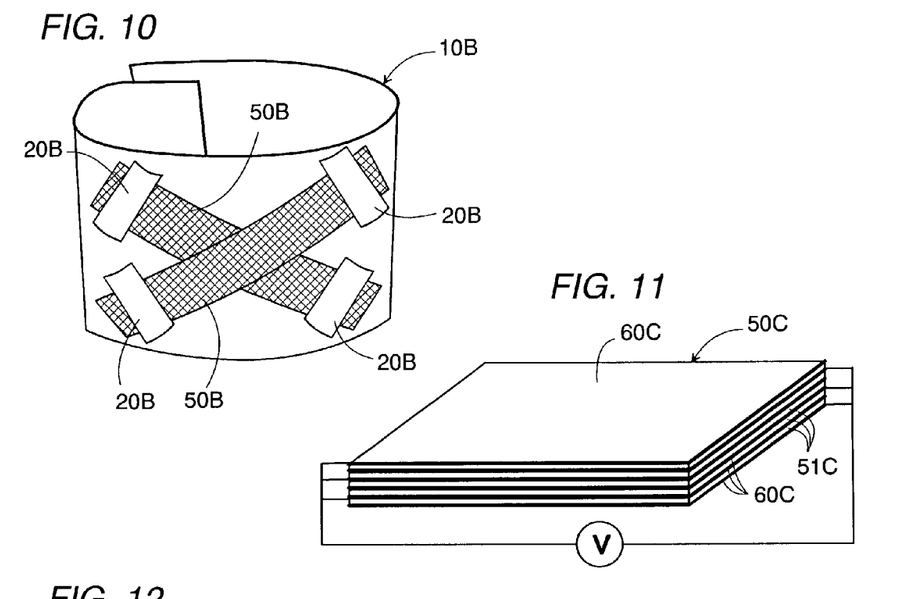
FIG. 10 is a perspective view of a wearable human motion applicator in accordance with a third embodiment of the present invention.
FIG. 11 is a schematic view of a like actuator which can be utilized in the above applicator.

FIG. 10 shows a third embodiment of the present invention which is designed to reduce distortion about a spine of the human body and includes a cylindrical torso support 10B wrapped around a torso of the human body. The torso support 10B is made from a flexible material and carries a pair of like actuators 50B which are shaped into bands extending circumferentially about a lengthwise axis of the support and crossing with each other on back of the support. Also carried on the support 10B are four sensors 20B which are provided respectively at portions corresponding to the opposite ends of each actuator 50B so as to obtain amounts of strains of the torso respectively about the lengthwise axis as well as about a horizontal axis perpendicular to the lengthwise axis. The output of the sensors 20B are processed by a like motion analyzer as utilized in the embodiment of FIG. 4 to give a strain signal indicative of the amounts of the strains. A like controller is included in this embodiment to give the driving DC voltage of varying level in response to the strain signal so as to elastically deform one or two of the actuators in a direction of reducing the amounts of the strains, i.e., the distortion of the torso.

FIG. 11 shows another actuator 50C of a laminated structure which may be utilized in the applicator of the present invention. The actuator 50C includes a plurality of sheet-like elastic dielectric cores 51C and a plurality of flat flexible electrodes 60C which are stacked alternately. Every alternate electrodes 60C are connected to the same electrical potential such that all the dielectric cores receive the same voltage difference to deform uniformly.

Figure 12:
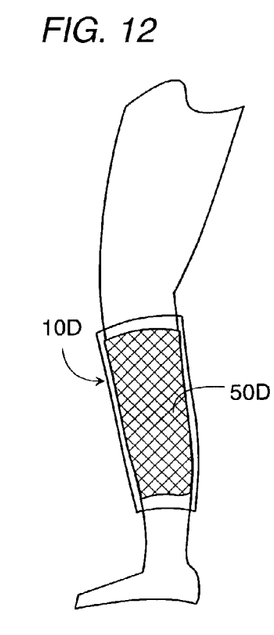
FIGS. 12 and 13 are schematic view of a wearable human motion applicator in accordance with a fourth embodiment of the present invention.
Figures 13, 14:
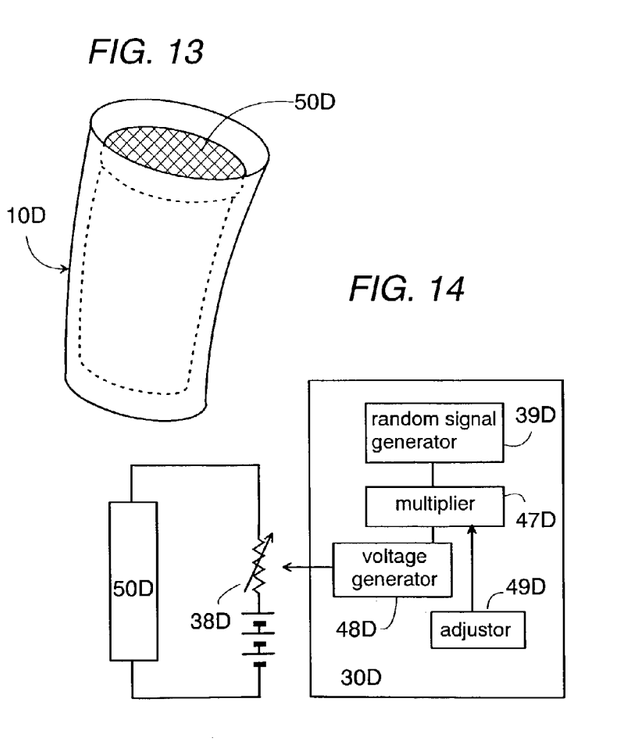
FIG. 14 is a block diagram showing an electric circuitry of the above applicator.

FIGS. 12 to 14 show a fourth embodiment of the present invention which is designed to give a massaging action to a lower limb of the human body, and includes a flexible tubular support 10D fitted around the lower limb adjacent a calf. In this embodiment, the support 10D carries a single elastic actuator 50D of a tubular configuration formed on the interior and exterior surfaces respectively with flexible electrodes. The tubular actuator 50D expands in a radial direction upon receiving the increasing driving DC voltage across the electrodes and contracts as the DC voltage decreases. Thus, it is made to repeat generating and releasing a pressing force applied to the lower limb of the human body for giving a massaging action thereto.

For this purpose, the controller 30D includes a random signal generator 39D which generates a random signal which is fed through a multiplier 47D to a voltage generator 48D where the signal is processed to provide the driving DC voltage of a suitable level to be supplied to the actuator 50D from the DC voltage source 38D. The controller 30D includes an adjustor 49D which causes the multiplier 47D to adjust the level of the resulting DC voltage for varying the massaging strength. Although the present embodiment utilizes the random signal generator 39D for randomly varying the strength of the force being applied to the human body, it is equally possible to apply a definite pattern of the varying DC voltage or to intermittently apply the constant DC voltage in order to repeat expanding and contracting the tubular actuator 50D for massaging the lower limb.

It is noted that the above controller 30D can be utilized in the previous embodiments, instead of the controller 30 shown in FIG. 4, such that the actuator generates a randomly varying force that is applied to bend or unbend the joint, inducing the counter-action by the human body for a training or rehabilitation purpose.

Figure 15:
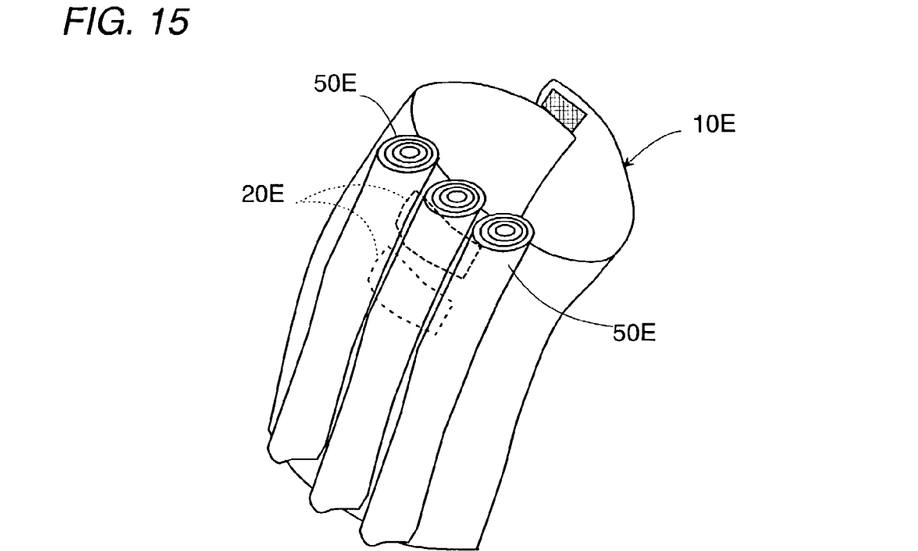
FIG. 15 is a perspective view of a wearable human motion applicator in accordance with a fifth embodiment of the present invention.
Figures 16, 17:
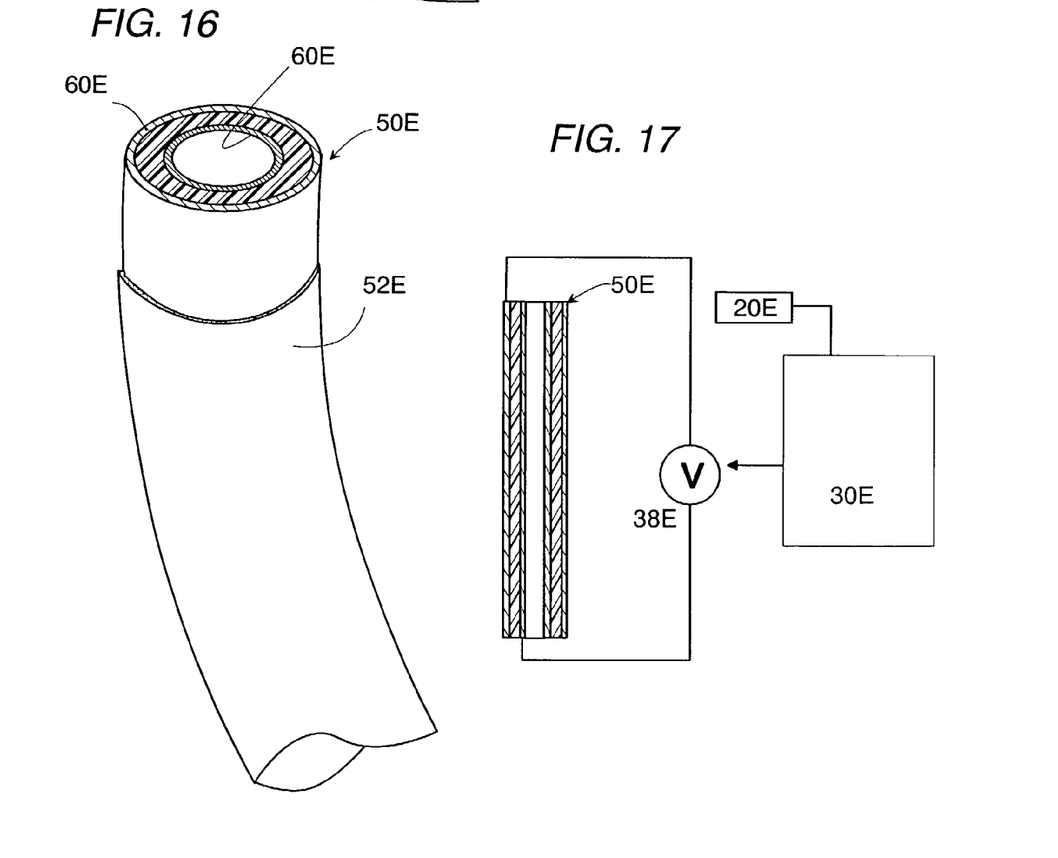
FIG. 16 is a perspective view of an actuator utilized in the above applicator.
FIG. 17 is sectional view of the above actuator shown with an insulation sheath being removed.

FIGS. 15 to 17 show a fifth embodiment of the present invention which is identical to the first embodiment except for use of actuators 50E each in the form of a fiber having a dielectric core 51E made of an elastomeric polymer into a hollow cylinder. The electrodes 60E, each formed by a mixture of carbon black and a precious metal filter, are dispersed in or coated on the interior and exterior surfaces of the hollow cylinder and are given flexibility sufficient to follow the elastic deformation of the hollow cylinder. Thus, the actuator 50E expands elastically in the lengthwise direction in proportion to the level of the driving DC voltage being applied the electrodes 60E. The fiber actuators 50E are arranged in an array and are secured to a front end of a like tubular sleeve 10E in a force-transmitting relation to the part of the body. The actuators 50E are electrically connected in parallel with each other across the DC voltage source 38E to simultaneously deform in accordance with an output from a controller 30E having an analogous configuration to that utilized in the first embodiment. In order to protect the outer electrodes 60E from an undesired electrical connection with an environment, each outer electrode 60E is surrounded by a dielectric sheath 52E. Sensors 20E are disposed interiorly of the support 10E for the same function as explained with reference to the first embodiment. In the structure of the fiber actuator, the outer electrode is given a large specific surface with respect to a cross section of the dielectric core so as to increase the electro-active force of deforming the actuator for efficient power drive with a minimum power requirement. Although the illustrated embodiment shows the actuator of a hollow structure, the actuator may be formed into a solid structure in which the center bore is filled entirely with the inside electrode 60E. This is advantageous for reducing a diameter of the fiber actuator.

Figure 18:
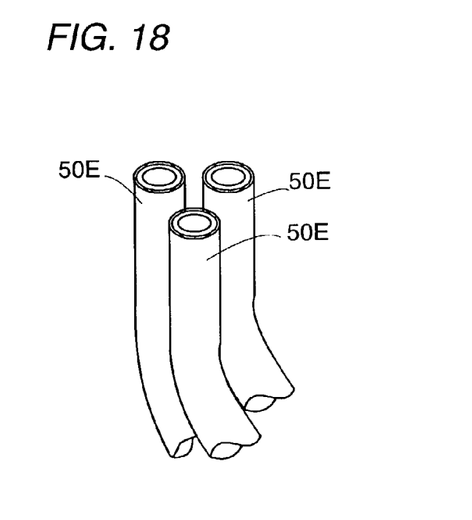
FIGS. 18 and 19 are schematic views respectively illustrating a packed assembly of the actuator which may be utilized in the above applicator.
Figure 19:
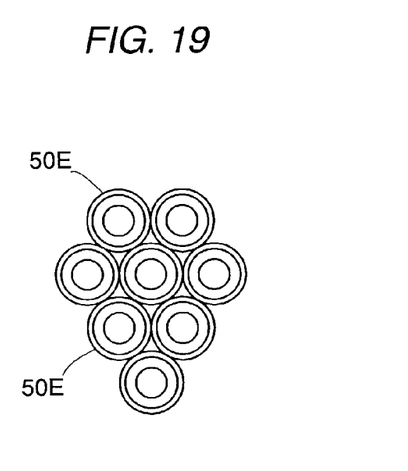

As shown in FIGS. 18 and 19, the fiber actuators 50E may be packed together to form a single actuator module which is secured to the support in order to give an enhanced force to the part of the human body.

Figure 20A:
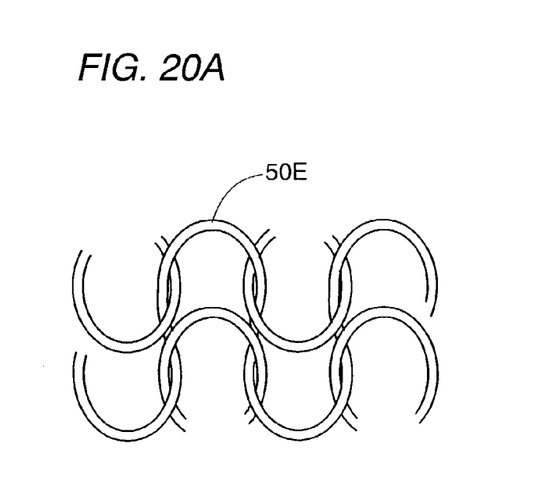
FIGS. 20A and 20B are schematic views respectively illustrating an actuator of knitted structure which can be utilized in the applicator of the present invention.
Figure 20B:
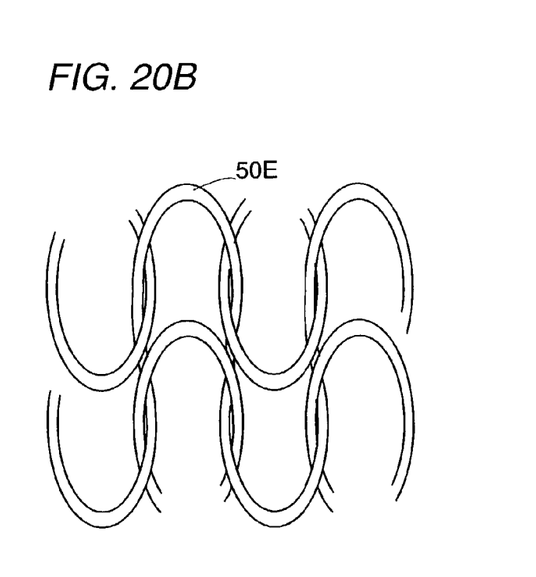
Figure 21A:
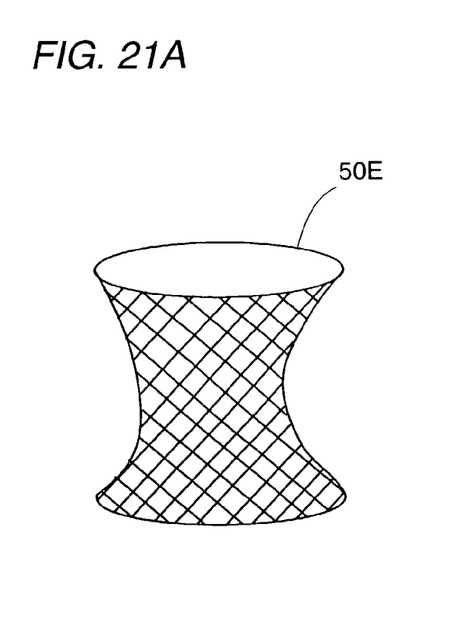
FIGS. 21A and 21B are schematic views respectively illustrating an actuator of cylindrical structure which can be utilized in the applicator of the present invention.
Figure 21B:
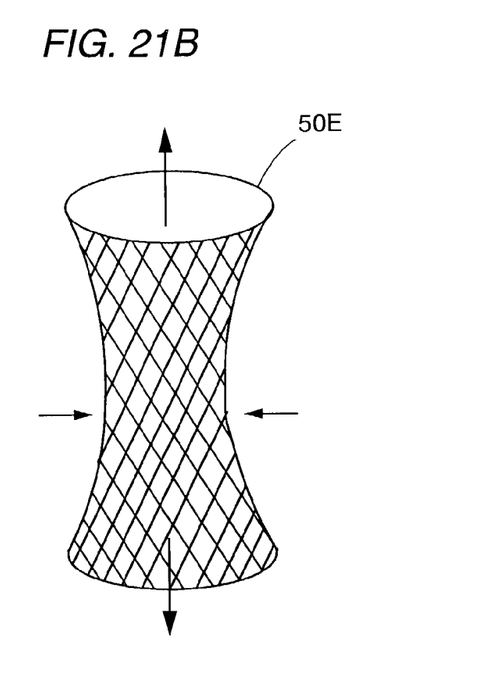

Alternatively, as shown in FIGS. 20A and 20B, the single fiber actuator 50E may be woven into a knitted structure having its own resiliency that is additive to the elastic deformability given to the fiber actuator. Since the knitted structure itself gives a preference direction of deformation, the electro-active deformation of the fiber actuator can be successfully guided along the preference direction so as to effectively and efficiently deform the actuator of knitted structure in the intended direction from the unenergized condition of FIG. 20A to the energized condition of FIG. 20B. Thus knitted actuator can be formed into a plan sheet secured to the support or into a sleeve surrounding a part of the human body. When formed into the plan sheet, the actuator can be well utilized in the above-mentioned embodiments shown in FIGS. 1, 8, 9, and 10. When formed into the sleeve, the actuator can be best utilized in the embodiment shown in FIG. 12. The sleeve actuator can be secured to the tubular support or even utilized to form a major portion of the support. In the latter case, the support can be designed simply for attaching the sleeve actuator to the part of the human body. As shown in FIG. 21A, when the actuator 50E is knitted into a sleeve of which diameter becomes less towards a longitudinal center than at the opposite longitudinal ends, the actuator can have an increased amount of elastic deformation along the longitudinal axis upon being energized, as shown in FIG. 21B.

Figure 22A:
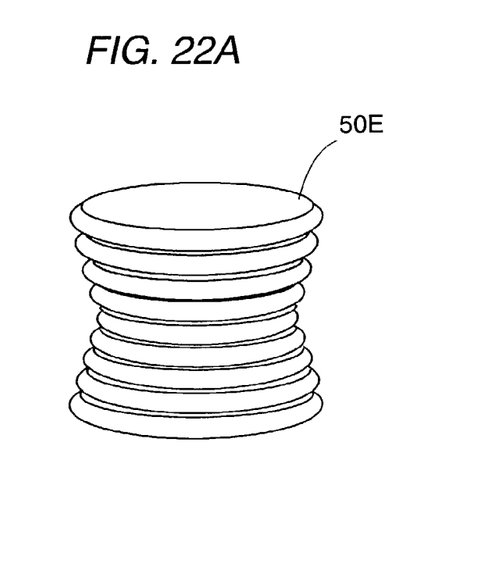
FIGS. 22A and 22B are schematic views respectively illustrating a coiled actuator which can be utilized in the applicator of the present invention.
Figure 22B:
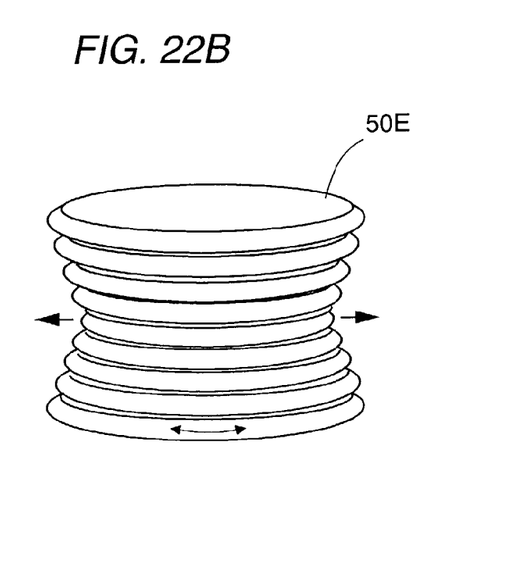

Further, as shown in FIG. 22A, the fiber actuator 50E can be coiled into a cylindrical shape for surrounding the part of the human body. When energized, the cylinder increases its diameter as a consequence of the fiber actuator expanding in the circumferential direction, as shown in FIG. 22B. Therefore, the coiled actuator can be best utilized in the embodiment of FIG. 12.

Figure 23:
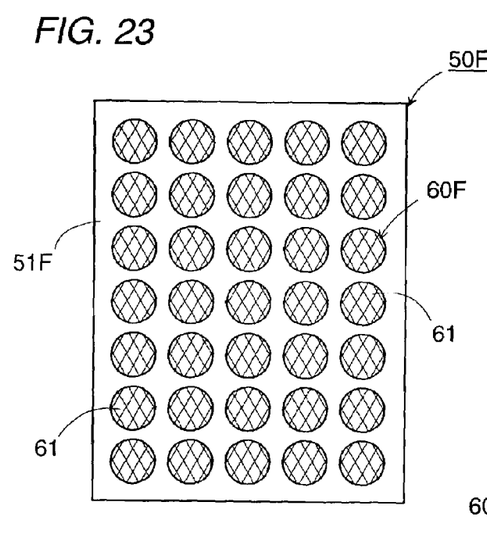
FIG. 23 is a plan view of an actuator with a plurality of flexible pads which can be utilized in the applicator of the present invention.
Figure 24:
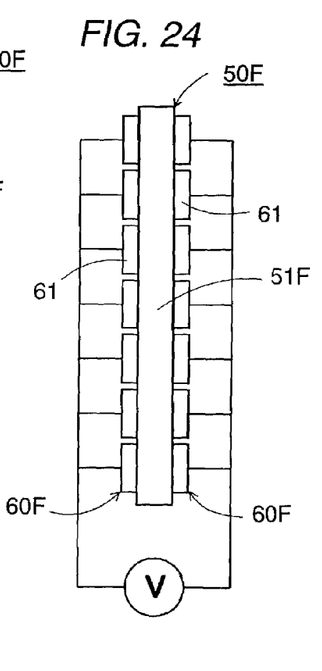
FIG. 24 is a schematic view illustrating an electric circuitry of the actuator.
Figure 25:
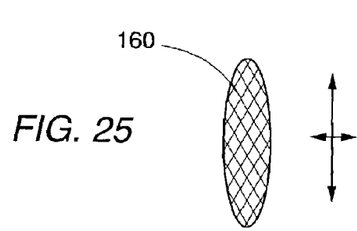
FIG. 25 is a schematic view of an elliptic electrode which can be incorporated in the above actuator.

FIGS. 23 and 24 show an actuator 50F of configuration which is different from those disclosed in the above but can be equally utilized in the applicator of the present invention. The actuator 50F is composed of a flat dielectric core 51F made of an elastomeric polymer and a plurality of flexible pads 61 disposed on opposite surfaces of the core 51F. The pads 150 on each surface of the core are joined to have the same electrical potential and define an electrode 60F. The pads 61 are circular and arranged in an array so as to be evenly spaced along a length and width of the dielectric core. Upon being supplied with the driving DC voltage across the electrodes, the actuator 50F is caused to firstly expand substantially equally in the length and width direction with attendant deformation of the flexible pads 61. In order to give a preference direction of the deformation, for example, in the lengthwise direction, each pad 61 may be configured into an ellipse having its major axis aligned in the length of the actuator 50F, as shown in FIG. 25.

Figure 26A:
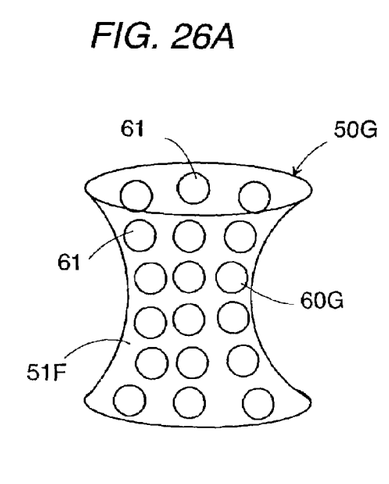
FIGS. 26A and 26B are perspective views illustrating an actuator shaped into a cylindrical configuration which can be utilized in the applicator of the present invention.
Figure 26B:
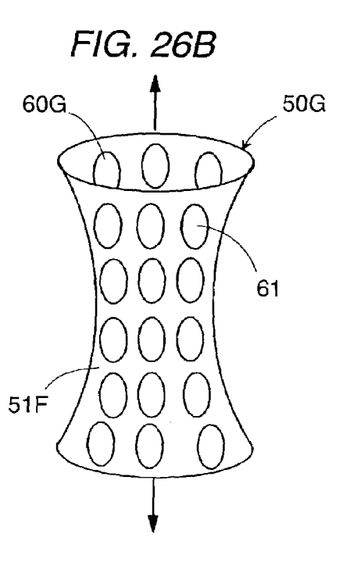

FIG. 26A show another actuator 50G which is shaped into a cylindrical configuration having a diameter smaller towards the axial center than at the axial ends. The actuator 50G includes a dielectric core 51G made of an elastomeric polymer and shaped into the cylinder. An array of flexible pads 61 are deposited on each of the interior and exterior surfaces of the cylinder to define the electrode 60G as is explained with reference to FIGS. 23 and 24. The cylindrical actuator 50G thus fabricated will expands largely in the axial direction with an attendant deformation of the flexible pads 61, as shown in FIG. 26B, upon being energized, and contracts as the driving DC voltage decreases. The cylindrical actuator 50G can be best utilized to wrap the part of the body in order to repeatedly stretch the whole circumference of the part.

Figure 27A:
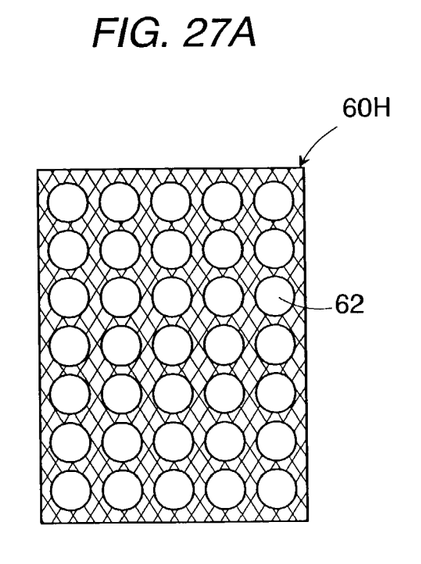
FIGS. 27A and 27B are view illustrating a further actuator with a perforated electrode which can be utilized in the applicator of the present invention.
Figure 27B:
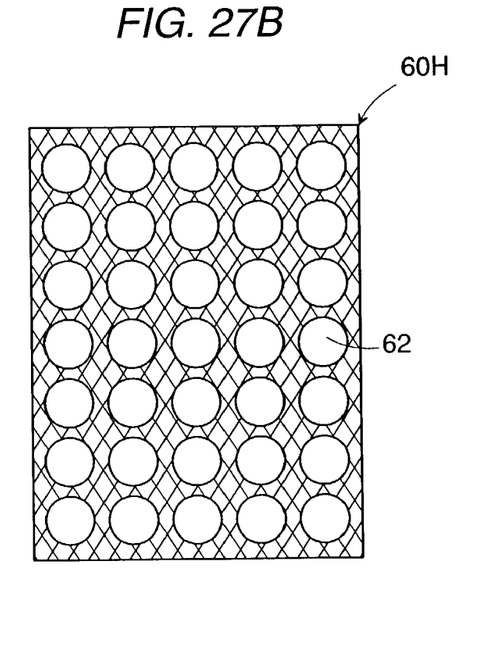

Instead of using the flexible pads, each electrode 60H may be perforated to have an array of voids 62, as shown in FIG. 27A, so as to be given sufficient flexibility in the length as well as width direction of the actuator. The actuator using thus perforated electrodes on either side of the dielectric core can also expand firstly in the length and width direction substantially equally, as shown in FIG. 27B, in response to the driving DC voltage being applied across the electrodes 60H.

Figure 28:
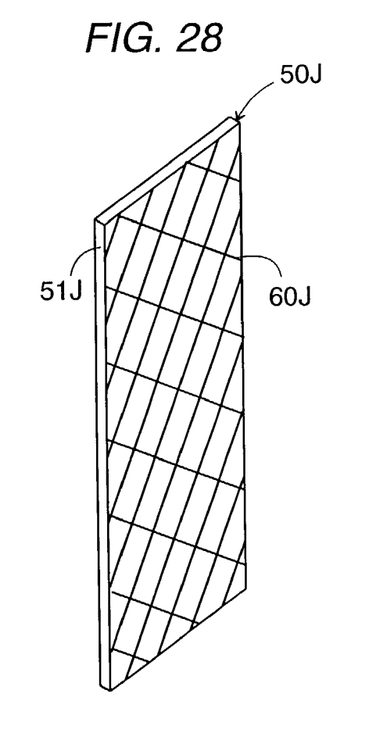
FIG. 28 is a perspective view of another actuator with a meshed electrode which can be utilized in the applicator of the present invention.
Figure 29:
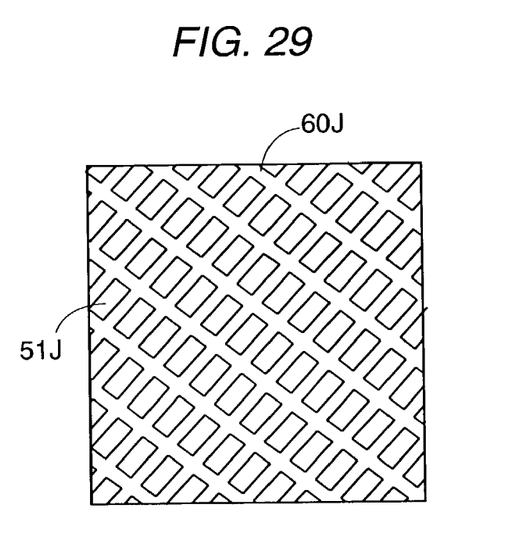
FIG. 29 is a plan view illustrating the meshed electrode of the above applicator.
Figure 30:
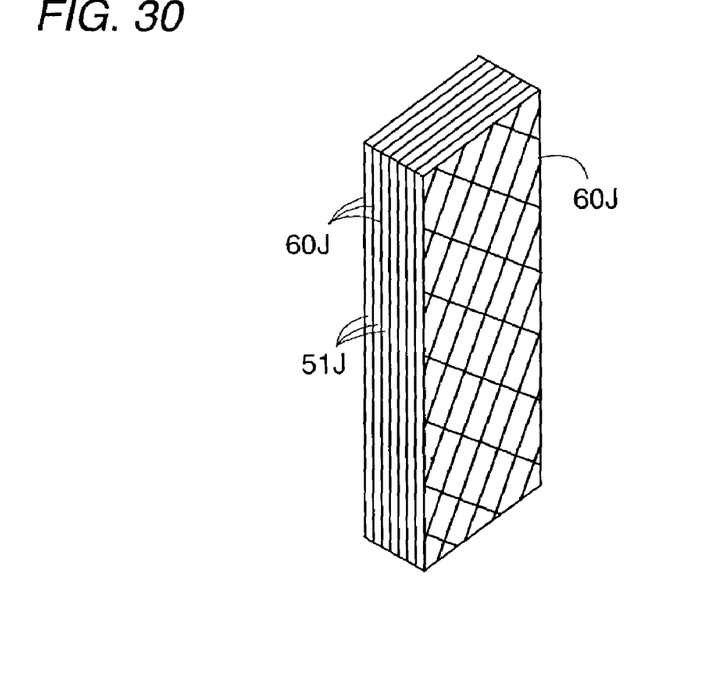
FIG. 30 is a perspective view of a still further actuator of a laminated structure which can be utilized in the applicator of the present invention.

FIGS. 28 and 29 show a sheet-like actuator 50J having a pair of electrodes each defined by a meshed membrane, which may be utilized in the applicator of the present invention. The actuator 50J is composed of the elastomeric polymer sheet forming the dielectric core 51J and the electrodes 60J of the meshed membrane on opposite surfaces of the core. The electrode 60J of the meshed membrane 60J is formed by a plurality of conductor lines intersecting with each other, as best shown in FIG. 29 to be given flexibility sufficient to follow the elastic deformation of the polymer or the dielectric core 51J. Thus, the whole actuator 50J is permitted to expand and contract smoothly to a large extent upon being applied or removal of the driving DC voltage. It is noted in this connection that the actuator with the meshed membrane electrodes may be shaped into any other suitable configuration, for example, into the cylindrical configuration. Further, more than two meshed membrane electrodes 60J may be stacked alternately with a corresponding number of the dielectric cores 51J to form an actuator of a laminated structure capable of generating great stretching and contracting force, as shown in FIG. 30.

Figure 31A:
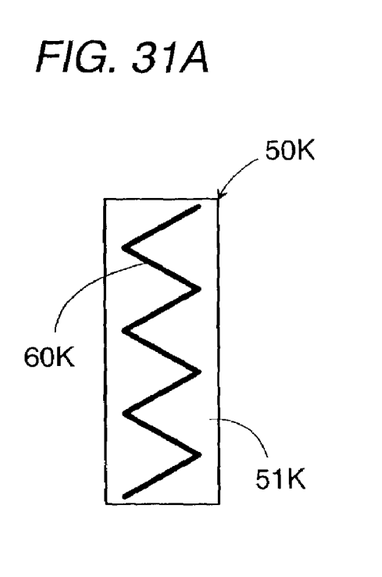
FIGS. 31A and 31B is a schematic view of an actuator with a pre-compressed electrode that can be incorporated in the above actuator.
Figure 31B:
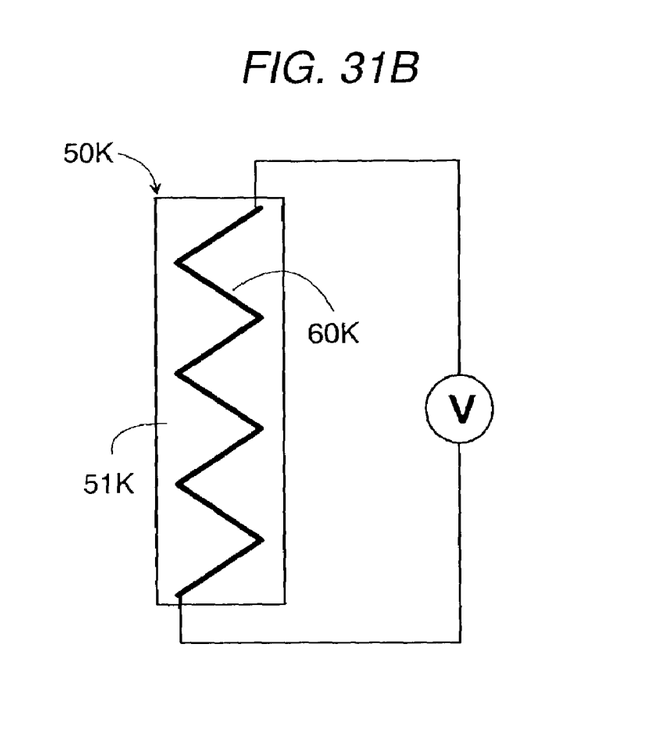

FIG. 31A shows a further applicator 50K with a pre-compressed electrode 60K on either side of the dielectric core 51K, which may be utilized in the applicator of the present invention. The electrode is made of a conductive wire shaped in a mechanical spring and is secured at its lengthwise ends respectively to the opposite longitudinal ends of the core 51K as being compressed in the length direction. Thus, the actuator is given a preference direction of deformation in which it is spring-biased, adding a resulting mechanical spring force to the electro-active force generated from the dielectric core upon receiving the driving DC voltage and therefore assuring a large amount of the total deformation made at the actuator, as shown in FIG. 31B.

It should be noted that the individual features disclosed herein with regard to the control of the applicator and the structure of the actuator can be suitably combined to present modifications which are also within the scope of the present invention.

The invention claimed is:

1. A wearable human motion applicator comprising:
   a support adapted to be fitted on a part of a human body;
   at least one electro-active elastic actuator carried by said support in a force-transmitting relation to said part of the human body, said elastic actuator including a dielectric core and a pair of electrodes on opposite surfaces of said core configured to receive a driving DC voltage thereacross, said elastic actuator having a length and elastically expanding in a lengthwise direction and therefore exerting a stretching force to said part of the human body to a greater extent as said driving DC voltage increases;
   a DC voltage source configured to provide said driving DC voltage;
   a controller configured to apply said driving DC voltage of varying levels to said elastic actuator, thereby generating a varying motion-inducing force to be applied to said part of the human body; and
   a signal generator configured to generate a random signal indicative of the driving DC voltage varying randomly, wherein:

said controller applies to said elastic actuator the driving DC voltage which varies randomly in accordance with the random signal.

2. The wearable human motion applicator as set forth in claim 1, wherein
said support is made of a flexible material and is adapted to be fitted around said part of the human body to give a tubular configuration surrounding said part,
said actuator being secured to said support so as to deform elastically together with said support.

3. The wearable human motion applicator as set forth in claim 1, further comprising:
a motion sensor configured to sense a motion of said part of the human body and provide a motion signal indicative of a quantity of the motion being made,
said controller, in response to said motion signal, applying said driving DC voltage of a level specific to said motion signal.

4. A wearable human motion applicator comprising:
a support adapted to be fitted on a part of a human body;
at least one electro-active elastic actuator carried by said support in a force-transmitting relation to said part of the human body, said elastic actuator including a dielectric core and a pair of electrodes on opposite surfaces of said core configured to receive a driving DC voltage thereacross, said elastic actuator having a length and elastically expanding in a lengthwise direction and therefore exerting a stretching force to said part of the human body to a greater extent as said driving DC voltage increases;
a DC voltage source configured to provide said driving DC voltage;
a controller configured to apply said driving DC voltage of varying levels to said elastic actuator, thereby generating a varying motion-inducing force to be applied to said part of the human body;
a selector; and
a direction sensor configured to sense a direction of a motion being made at said part to provide a direction signal indicative of the direction of the motion,
said controller providing a motion-assisting mode and a motion-training mode, said motion-assisting mode being such that said controller, in response to said direction signal, gives said driving DC voltage of a level that deforms said elastic actuator in a direction of assisting the motion being made by the human body,
said motion-training mode being such that said controller, in response to said direction signal, gives said driving DC voltage of a level that deforms said elastic actuator in a direction of opposing the motion being made by the human body, and
said selector activating one of said motion-assisting mode and said motion-training mode, selectively.

5. The wearable human motion applicator as set forth in claim 4 wherein:
said support is adapted to be fitted around a joint of the human body, said applicator including a motion sensor configured to sense a direction and a quantity of the motion around said joint to provide a motion signal indicative of the direction and the quantity of the motions,
said controller, in response to said motion signal, applying to the elastic actuator the driving DC voltage of a level deforming the elastic actuator in a direction of assisting the bending or unbending of the joint.

6. The wearable human motion applicator as set forth in claim 4 wherein:
said support of the tubular configuration has a lengthwise axis and is adapted to be fitted around a joint of the human body,
two of said elastic actuators being disposed on diametrically opposite ends of said support of the tubular configuration about said lengthwise axis in correspondence to front and rear sides of the joint, respectively, each of said elastic actuator being supplied with said driving DC voltage of varying levels,
said applicator including a motion sensor configured to sense a direction and a quantity of the motion around said joint to provide a motion signal indicative of the direction and the quantity of the motion being made, and
said controller, in response to said motion signal, selecting one of said elastic actuators and applying thereto the driving DC voltage of a level expanding the same elastic actuator in a direction of assisting the bending or unbending of the joint.

7. The wearable human motion applicator as set forth in claim 6, wherein
said controller, in response to said motion signal, selects one of said elastic actuators and applies thereto said driving DC voltage of a high level expanding the same elastic actuator and at the same time applies to the other elastic actuator said driving DC voltage of a low level contracting it from an expanded condition for assisting the bending or unbending of the joint.

8. A wearable human motion applicator comprising:
a support adapted to be fitted on a part of a human body;
at least one electro-active elastic actuator carried by said support in a force-transmitting relation to said part of the human body, said elastic actuator including a dielectric core and a pair of electrodes on opposite surfaces of said core configured to receive a driving DC voltage thereacross, said elastic actuator having a length and elastically expanding in a lengthwise direction and therefore exerting a stretching force to said part of the human body to a greater extent as said driving DC voltage increases;
a DC voltage source configured to provide said driving DC voltage; and
a controller configured to apply said driving DC voltage of varying levels to said elastic actuator, thereby generating a varying motion-inducing force to be applied to said part of the human body, wherein:
said support is made of a flexible material and is adapted to be fitted around said part of the human body to give a tubular configuration surrounding said part,
said actuator is secured to said support so as to deform elastically together with said support, and
said support of the tubular configuration has a lengthwise axis and is adapted to be fitted around a torso of the human body,
two of said elastic actuators being secured on said support and each shaped into a band extending around said lengthwise axis, said two of said elastic actuators extending at different angles with respect to said lengthwise axis to cross with each other,
said applicator including a motion sensor configured to sense amounts of strains of said torso respectively about said lengthwise axis as well as a horizontal axis perpendicular to said lengthwise axis, and provide a strain signal indicative of the amounts of the strains, and
said controller, in response to said strain signal, giving to said elastic actuators respectively the driving DC voltages of varying levels in order to elastically deform said elastic actuators in a direction of reducing the amounts of the strain.

9. A wearable human motion applicator comprising:

a support adapted to be fitted on a part of a human body;

at least one electro-active elastic actuator carried by said support in a force-transmitting relation to said part of the human body, said elastic actuator including a dielectric core and a pair of electrodes on opposite surfaces of said core configured to receive a driving DC voltage thereacross, said elastic actuator having a length and elastically expanding in a lengthwise direction and therefore exerting a stretching force to said part of the human body to a greater extent as said driving DC voltage increases;

a DC voltage source configured to provide said driving DC voltage;

a controller configured to apply said driving DC voltage of varying levels to said elastic actuator, thereby generating a varying motion-inducing force to be applied to said part of the human body; and a motion sensor configured to sense a motion of said part of the human body and provide a motion signal indicative of a quantity of the motion being made, wherein:

said controller, in response to said motion signal, applies said driving DC voltage of a level specific to said motion signal, and said controller includes:

a table storing a plurality of programs respectively assigning different levels of said driving DC voltage to the sensed quantity of the motion; and a program selector configured to select one of said programs for deforming said elastic actuator in accordance with the selected program.

* * * * *